(12) United States Patent
Cheng et al.

(10) Patent No.: US 6,468,897 B1
(45) Date of Patent: Oct. 22, 2002

(54) METHOD OF FORMING DAMASCENE STRUCTURE

(75) Inventors: Chi-Feng Cheng, Yuan-Lin Cheng (TW); Cheng-Chen Calvin Hsueh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/863,919

(22) Filed: May 23, 2001

(51) Int. Cl.[7] ................................. H01L 21/4763
(52) U.S. Cl. ....................... 438/637; 438/691
(58) Field of Search ........................ 438/633, 637, 438/672, 675, 687, 634, 640, 691

(56) References Cited

U.S. PATENT DOCUMENTS

| | | | |
|---|---|---|---|
| 4,717,631 A | * | 1/1988 | Kaganowicz et al. |
| 5,895,259 A | * | 4/1999 | Carter et al. |
| 6,022,754 A | * | 2/2000 | Guillemet et al. |
| 6,103,619 A | * | 8/2000 | Lai |
| 6,265,781 B1 | * | 7/2001 | Andreas |
| 6,358,849 B1 | * | 3/2002 | Havemann et al. |

* cited by examiner

Primary Examiner—David Nelms
Assistant Examiner—Phuc T. Dang
(74) Attorney, Agent, or Firm—J.C. Patents

(57) ABSTRACT

A method of forming a damascene structure. A dielectric layer is formed over a substrate. The dielectric layer is a silicon oxynitride layer having a refractivity between 1.55 and 1.74. An opening is formed in the dielectric layer. A metallic layer that covers the substrate and completely fills the opening is formed. A chemical-mechanical polishing operation is conducted to remove excess metallic material outside the opening using the dielectric layer as a polishing stop layer. The dielectric layer has a polishing rate less than that of the metallic layer.

20 Claims, 2 Drawing Sheets

METHOD OF FORMING DAMASCENE STRUCTURE

BACKGROUND OF THE INVENTION

1. Field of Invention

The present invention relates to a semiconductor device. More particularly, the present invention relates to a method of forming a damascene structure.

2. Description of Related Art

In semiconductor manufacturing, damascene processes are a frequently employed technique for forming interconnects such as conductive lines, contacts or vias. By embedding conductive material within a dielectric layer to form conductive connections, the technique for forming a damascene structure remains unchanged even when a different conductive material is selected. Furthermore, familiar methods such as plasma etching or reactive ion etching (RIE) can be used to form an opening in the dielectric layer and the dielectric layer can be globally planarized by chemical-mechanical polishing (CMP).

To form a conventional damascene structure, a dielectric layer is formed over a substrate having a conductive region thereon and then a polishing stop layer is formed over the dielectric layer. An opening is formed in the polishing stop layer and the dielectric layer. The opening can be a contact opening, a via opening, a conductive line trench or a damascene opening. The opening exposes a portion of the conductive region in the substrate. A metallic layer is formed over the substrate and completely fills the opening. Finally, chemical-mechanical polishing is conducted to remove excess metallic material outside the opening.

However, difference in polishing rate between the polishing stop layer and the metallic layer in chemical-mechanical polishing is generally small. Due to their closeness in polishing rate and pattern density effect, dielectric material loss, metallic layer erosion and dishing effect will occur in the high-density pattern regions of a silicon wafer.

SUMMARY OF THE INVENTION

Accordingly, one object of the present invention is to provide a method of forming a damascene structure such that a dielectric layer having a high polishing selectivity ratio relative to the metallic layer is used. Hence, there is no need for forming a polishing stop layer.

A second object of this invention is to provide a method of forming a damascene structure capable of preventing dielectric material loss, metallic erosion and dishing effect due to chemical-mechanical polishing of a metallic layer.

To achieve these and other advantages and in accordance with the purpose of the invention, as embodied and broadly described herein, the invention provides a method of forming a damascene structure. First, a substrate is provided. A dielectric layer is formed over the substrate. The dielectric layer is a silicon oxynitride layer having a refractivity between about 1.55 and 1.74 for a light beam having a wavelength of about 673 nm. Furthermore, this dielectric layer has a high polishing selectivity ratio relative to a subsequently formed metallic layer. An opening is formed in the dielectric layer. The opening can be a contact opening, a via opening, a conductive line trench or a damascene opening according to design requirements. A metallic layer that covers the substrate and completely fills the opening is formed. Finally, a chemical-mechanical polishing operation is conducted to remove excess metallic material outside the opening using the dielectric layer as a polishing stop layer.

In this invention, one major aspect is the selection of a material having a high polishing selectivity ratio relative to the metallic layer to serve as the material for forming the dielectric layer in the damascene structure. Due to the high intrinsic polishing selectivity ratio with respect to the metallic layer, no extra polishing stop layer is required. Hence, the process is very much simplified.

Furthermore, the polishing selectivity ratio of the dielectric layer relative to the metallic layer is much higher than the polishing selectivity ratio between a conventional polishing stop layer and the metallic layer. Therefore, dielectric material loss, metallic erosion and dishing effect are considerably reduced after a chemical-mechanical polishing of the metallic layer down to the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
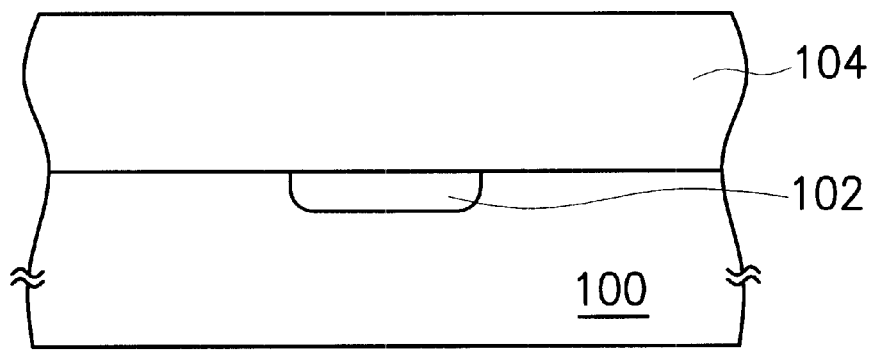
FIGS. 1A through 1D are schematic cross-sectional views showing the progression of steps for producing a dual damascene structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the progression of steps for producing a dual damascene structure according to one preferred embodiment of this invention. As shown in FIG. 1A, a substrate 100 having a conductive region 102 thereon is provided. A dielectric layer 104 is formed over the substrate 100. The dielectric layer 104 can be a silicon oxynitride layer having a refractivity of about 1.55 to 1.74 for a light beam at a wavelength of about 673 nm. Furthermore, the dielectric layer 104 has a high polishing selectivity ratio relative to a subsequently formed metallic layer. The dielectric layer 104 can be formed, for example, by performing a plasma-enhanced chemical vapor deposition (PECVD). The PECVD process is conducted at a temperature of about 600° C., an operating pressure between about 0.1 and 5 Torrs, an operating power between about 50 W and 1000 W by passing silane, dinitrogen oxide and nitrogen. The ratio of silane to dinitrogen oxide is between about 0.05 and 1.5 and the flow rate of nitrogen is between about 10 sccm and 1000 sccm.

Figure 1B:
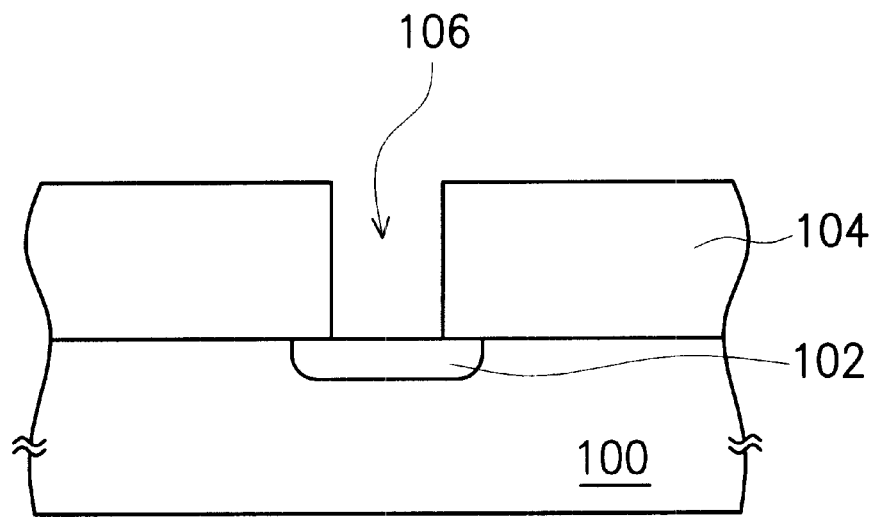

As shown in FIG. 1B, an opening 106 that exposes a portion of the conductive region 102 is formed in the dielectric layer 104. The opening 106 can be a contact opening, a via opening, a conductive line trench or a damascene opening according to design requirements. The opening 106 is formed, for example, by forming a patterned photoresist layer (not shown) over the dielectric layer 104 and performing an anisotropic etching operation.

Figure 1C:
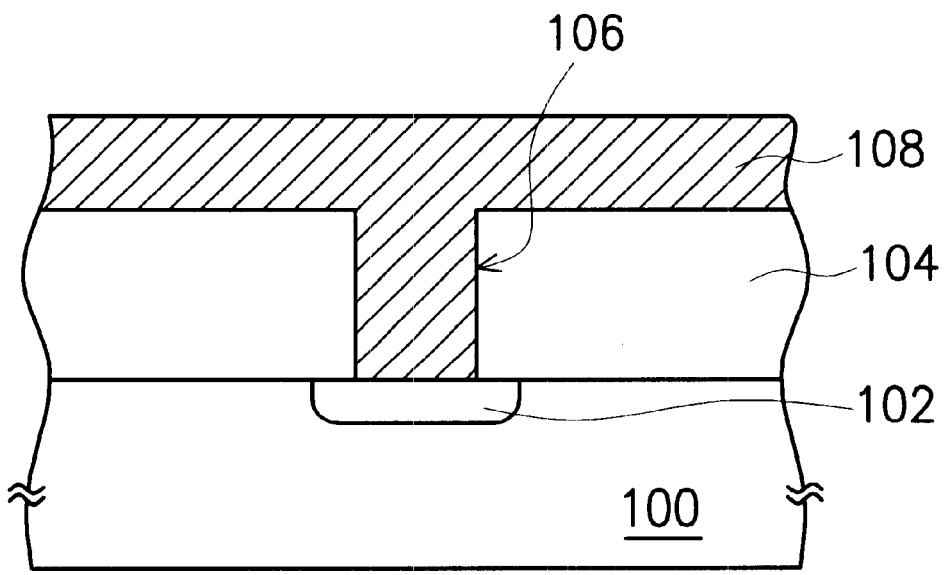

As shown in FIG. 1C, a metallic layer 108 is formed over the substrate 100. The metallic layer 108 completely fills the opening 106. The metallic layer 106 can be an aluminum layer, a copper layer or a tungsten layer, for example. The metallic layer 108 is formed, for example, by chemical vapor deposition or DC magnetron sputtering.

Figure 1D:
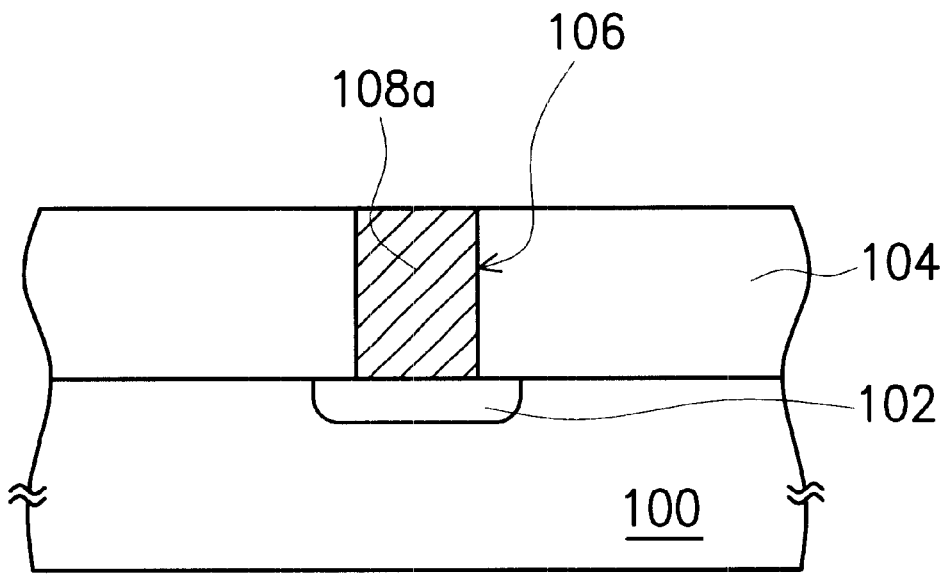

As shown in FIG. 1D, a portion of the metallic layer 108 is removed to form a conductive layer 108a that completely fills the opening 106. The conductive layer 108a is formed, for example, by removing excess metallic material outside the opening 106 in a chemical-mechanical polishing (CMP) operation using the dielectric layer 104 as a polishing stop layer. In the CMP operation, the dielectric layer 104 has a high polishing selectivity ratio relative to the metallic layer 108, that is, the polishing rate of the dielectric layer 104 is considerably lower than that of the metallic layer 108. Hence, dielectric material loss, metallic erosion and dishing effect are prevented after the metallic layer 108 is polished down to the dielectric layer 104.

In summary, one major aspect of this invention is the selection of a material having a high polishing selectivity ratio relative to the metallic layer to serve as the material for forming the dielectric layer in the damascene structure. Due to the high intrinsic polishing selectivity ratio with respect to the metallic layer, no extra polishing stop layer is required. Hence, the process is very much simplified.

Furthermore, the polishing selectivity ratio of the dielectric layer relative to the metallic layer is much higher than the polishing selectivity ratio between a conventional polishing stop layer and the metallic layer. Therefore, dielectric material loss, metallic erosion and dishing effect are considerably reduced after a chemical-mechanical polishing of the metallic layer down to the dielectric layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a damascene structure, comprising:
   providing a substrate;
   forming a dielectric layer over the substrate, wherein the dielectric layer is a silicon oxynitride layer having a refractivity of between about 1.55 and 1.74 for a light beam having a wavelength of about 673 nm;
   forming an opening in the dielectric layer,
   forming a metallic layer over the dielectric layer, wherein the metallic layer completely fills the opening; and
   conducting a chemical-mechanical polishing operation to remove excess metallic material outside the opening while using the dielectric layer as a polishing stop layer, wherein the dielectric layer has a polishing rate less than that of the metallic layer.

2. The method of claim 1, wherein forming the dielectric layer includes conducting a plasma-enhanced chemical vapor deposition process using a gaseous mixture of silane, dinitrogen oxide and nitrogen.

3. The method of claim 2, wherein a ratio of silane to dinitrogen oxide in the gaseous mixture is between about 0.05 and 1.5.

4. The method of claim 2, wherein a flow rate of nitrogen is between about 10 sccm and 1000 sccm.

5. The method of claim 2, wherein the plasma-enhanced chemical vapor deposition process is conducted at a temperature between about 200° C. and 600° C.

6. The method of claim 2, wherein the plasma-enhanced chemical vapor deposition process is conducted at an operating pressure between about 0.1 Torrs and 5 Torrs.

7. The method of claim 2, wherein the plasma-enhanced chemical vapor deposition process is conducted at an operating power between about 50 W and 1000 W.

8. The method of claim 1, wherein the metallic layer comprises a material selected from a group consisting of copper, aluminum and tungsten.

9. A method of forming a contact/via, comprising:
   providing a substrate;
   forming a dielectric layer over the substrate, wherein the dielectric layer is a silicon oxynitride layer having a refractivity of between about 1.55 and 1.74 for a light beam having a wavelength of about 673 nm;
   forming a contact/via opening in the dielectric layer;
   forming a metallic layer over the dielectric layer, wherein the metallic layer completely fills the contact/via opening; and
   conducting a chemical-mechanical polishing operation to remove excess metallic material outside the contact/via opening while using the dielectric layer as a polishing stop layer.

10. The method of claim 9, wherein forming the dielectric layer includes conducting a plasma-enhanced chemical vapor deposition operation using a gaseous mixture of silane, dinitrogen oxide and nitrogen.

11. The method of claim 10, wherein a ratio of silane to dinitrogen oxide in the gaseous mixture is between about 0.05 and 1.5.

12. The method of claim 10, wherein a flow rate of nitrogen is between about 10 sccm and 1000 sccm.

13. The method of claim 10, wherein the plasma-enhanced chemical vapor deposition process is conducted at a temperature between about 200° C. and 600° C., an operating pressure between about 0.1 Torrs and 5 Torrs and an operating power between about 50 W and 1000 W.

14. The method of claim 9, wherein the metallic layer comprises a material selected from a group consisting of copper, aluminum and tungsten.

15. A method of forming a conductive line, comprising:
   providing a substrate;
   forming a dielectric layer over the substrate, wherein the dielectric layer is a silicon oxynitride layer having a refractivity of between about 1.55 and 1.74 for a light beam having a wavelength of about 673 nm;
   forming a conductive line trench in the dielectric layer,
   forming a metallic layer over the dielectric layer, wherein the metallic layer completely fills the conductive line trench; and
   conducting a chemical-mechanical polishing operation to remove excess metallic material outside the conductive line trench while using the dielectric layer as a polishing stop layer.

16. The method of claim 15, wherein forming the dielectric layer includes conducting a plasma-enhanced chemical vapor deposition operation using a gaseous mixture of silane, dinitrogen oxide and nitrogen.

17. The method of claim 16, wherein a ratio of silane to dinitrogen oxide in the gaseous mixture is between about 0.05 and 1.5.

18. The method of claim 16, wherein a flow rate of nitrogen is between about 10 sccm and 1000 sccm.

19. The method of claim 16, wherein the plasma-enhanced chemical vapor deposition process is conducted at a temperature between about 200° C. and 600° C., an pressure between about 0.1 Torrs and 5 Torrs and an operating power between about 50 W and 1000 W.

20. The method of claim 15, wherein the metallic layer comprises a material selected from a group consisting of copper, aluminum and tungsten.

* * * * *